(12) United States Patent
Lai et al.

(10) Patent No.: US 11,791,402 B2
(45) Date of Patent: Oct. 17, 2023

(54) SEMICONDUCTOR DEVICE HAVING STRAINED CHANNELS

(71) Applicant: Taiwan Semiconductor Manufacturing Co., Ltd., Hsinchu (TW)

(72) Inventors: Wei-Jen Lai, Keelung (TW); Wei-Yuan Lu, Taipei (TW); Chia-Pin Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/320,428

(22) Filed: May 14, 2021

(65) Prior Publication Data

US 2022/0367670 A1    Nov. 17, 2022

(51) Int. Cl.
  *H01L 29/66* (2006.01)
  *H01L 29/78* (2006.01)
  *H01L 21/8234* (2006.01)

(52) U.S. Cl.
  CPC .. *H01L 29/6681* (2013.01); *H01L 21/823412* (2013.01); *H01L 21/823418* (2013.01); *H01L 21/823431* (2013.01); *H01L 29/66553* (2013.01); *H01L 29/7851* (2013.01)

(58) Field of Classification Search
  CPC ........... H01L 29/6681; H01L 29/66553; H01L 29/7851; H01L 21/823412; H01L 21/823418; H01L 21/823431
  See application file for complete search history.

(56) References Cited

U.S. PATENT DOCUMENTS

| | | |
|---|---|---|
| 9,818,872 B2 | 11/2017 | Ching et al. |
| 9,887,269 B2 | 2/2018 | Ching et al. |
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2018/0175036 A1 | 6/2018 | Ching et al. |
| 2020/0098643 A1* | 3/2020 | Cheng ............. H01L 21/823814 |
| 2020/0105929 A1* | 4/2020 | Zhang ................ H01L 29/1033 |
| 2021/0202481 A1* | 7/2021 | Fulford ................ H01L 29/775 |

* cited by examiner

*Primary Examiner* — Christine A Enad
(74) *Attorney, Agent, or Firm* — HAYNES AND BOONE, LLP

(57) ABSTRACT

A method according to the present disclosure includes depositing, over a substrate, a stack including channel layers interleaved by sacrificial layers, forming a first fin structure and a second fin in a first area and a second area of the substrate, depositing a first dummy gate stack over the first fin structure and a second dummy gate stack over the second fin structure, recessing source/drain regions of the first fin structure and second fin structure to form first source/drain trenches and second source/drain trenches, selectively and partially etching the sacrificial layers to form first inner spacer recesses and second inner spacer recesses, forming first inner spacer features in the first inner spacer recesses, and forming second inner spacer features in the second inner spacer recesses. A composition of the first inner spacer features is different from a composition of the second inner spacer features.

20 Claims, 16 Drawing Sheets

SEMICONDUCTOR DEVICE HAVING STRAINED CHANNELS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Inner spacer features have been implemented in MBC transistors to space a gate structure away from an epitaxial source/drain feature and to protect source/drain features during channel release processes. In conventional technologies, inner spacer features for n-type MBC transistors and p-type MBC transistors have the same composition and are not configured to strain channel members differently to enhance carrier mobility in different device regions. Therefore, while conventional multi-gate structures may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
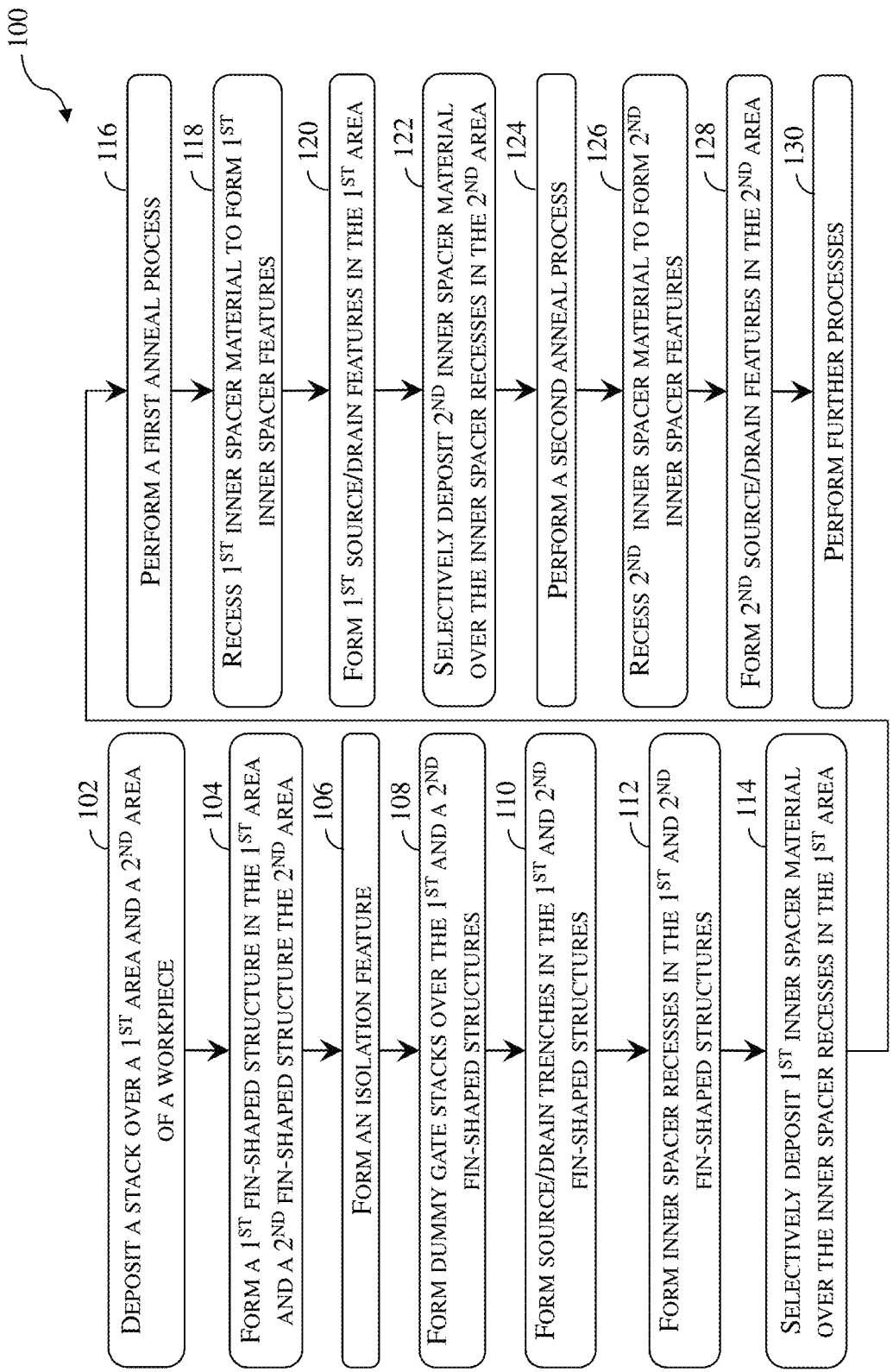
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to different inner spacer features for differently strained channel members in different device areas.

As described above, MBC transistors may also be referred to as SGTs, GAA transistors, nanosheet transistors, or nanowire transistors. They can be either n-type or p-type. Inner spacer features have been implemented between channel members to isolate a gate structure from a source/drain feature and to protect source/drain features from being damaged during channel release processes. As dimensions of semiconductor device continue to shrink, it becomes increasingly difficult to enhance carrier mobility in channel members. The most common silicon substrate for fabrication of semiconductor device has its surface on the (100) crystalline surface to maximize the electron mobility along the <110> direction. However, holes are the primary charge carriers for p-type MBC transistor and hole mobility on the (100) crystalline surface is less than ideal. In conventional technologies, channel members may be strained by source/drain features to improve carrier mobility. In those conventional technologies, inner spacer features are substantially stress-free and do not exert any stress on the channel members. Additionally, conventional inner spacer features for different types of MBC transistors are of the same composition. As a result, conventional MBC transistors may not have satisfactory performance.

The present disclosure provides different inner spacer features for n-type devices and p-type devices to provide differently strained channel members. Methods of the present disclosure separately form first inner spacer features to interleave channel members for n-type devices and second inner spacer features to interleave channel members of p-type devices. A composition of the first inner spacer features is different from a composition of the second inner spacer features. Upon annealing, the first inner spacers may exert a compressive stress on the channel members in the n-type device area and the second inner spacers may exert a tensile stress on the channel members in the p-type device area. The compressive stress may enhance electron mobility in the channel members for the n-type devices and the tensile stress may enhance hole mobility in the channel members in the p-type devices. By enhancing the carrier mobility for both types of devices, methods of the present disclosure may produce a semiconductor device of improved performance.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-16, which illustrate fragmentary cross-sectional views of the workpiece at different stages of fabrication according to embodiments of method 100.

Figure 2:
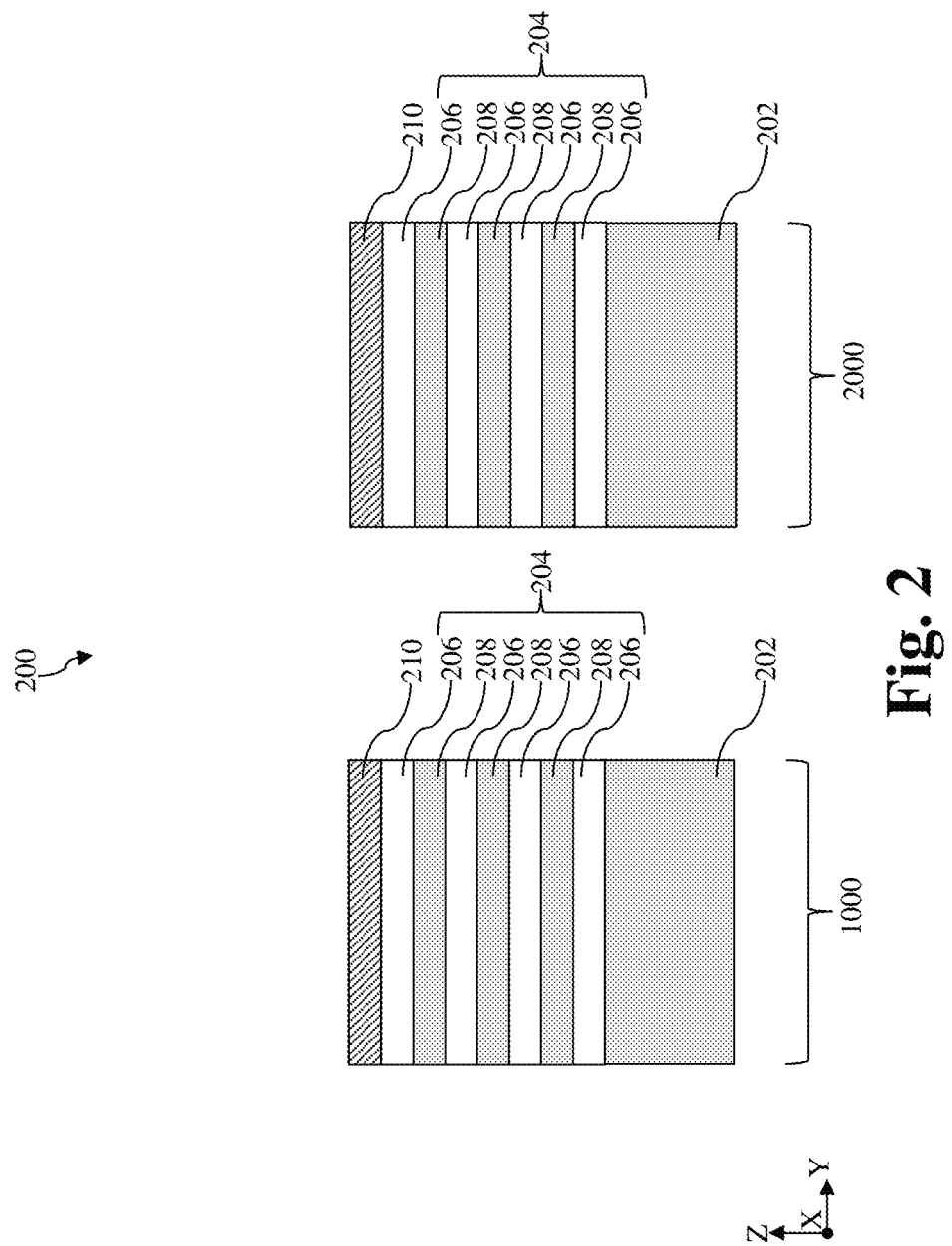
FIGS. 2-16 illustrate fragmentary cross-sectional views of a workpiece during a fabrication process according to the method of FIG. 1, according to one or more aspects of the present disclosure.

Referring to FIGS. 1 and 2, method 100 includes a block 102 where a stack 204 is deposited on a first area 1000 and a second area 2000 of a workpiece 200. Because a semiconductor device will be formed from the workpiece 200, the workpiece 200 may be referred to as a semiconductor device 200 as the context requires. The workpiece 200 includes a substrate 202. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. In some embodiments, the first area 1000 is an n-type device area where n-type MBC transistors are disposed and the second area 2000 is a p-type device area where p-type MBC transistors are disposed. Although not explicitly shown, the substrate 202 may include a p-type well in the first area 1000 and an n-type well in the second area 2000. Each of the p-well and the n-well includes a doping profile. The n-type well includes a doping profile of an n-type dopant, such as phosphorus (P) or arsenic (As). The p-type well includes a doping profile of a p-type dopant, such as boron (B). The doping the n-type well and the p-type well may be formed using ion implantation or thermal diffusion and may be consider portions of the substrate 202.

The stack 204 deposited at block 102 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. Suitable epitaxial processes for stack 104 include CVD deposition techniques (e.g., vapor-phase epitaxy (VPE) and/or ultra-high vacuum CVD (UHV-CVD)), molecular beam epitaxy (MBE), and/or other suitable processes. As shown in FIG. 2, at block 102, the sacrificial layers 206 and the channel layers 208 are deposited alternatingly, one-after-another, to form the stack 204 over the first area 1000 and the second area 2000. It is noted that four (4) layers of the sacrificial layers 206 and three (3) layers of the channel layers 208 are alternately and vertically arranged as illustrated in FIG. 2, which are for illustrative purposes only and not intended to be limiting beyond what is specifically recited in the claims. The number of layers depends on the desired number of channels members for the device 200. In some embodiments, the number of the channel layers 208 is between 2 and 10. According to present disclosure, in order to satisfactorily strain all the channel layers in subsequent process, each of the channel layers 208 is sandwiched between two sacrificial layers 206. For patterning purposes, the workpiece 200 may include a hard mask layer 210 over the stack 204. The hard mask layer 210 may be a single layer or a multilayer. In one example, the hard mask layer 210 includes a silicon oxide layer and a silicon nitride layer.

Figure 3:
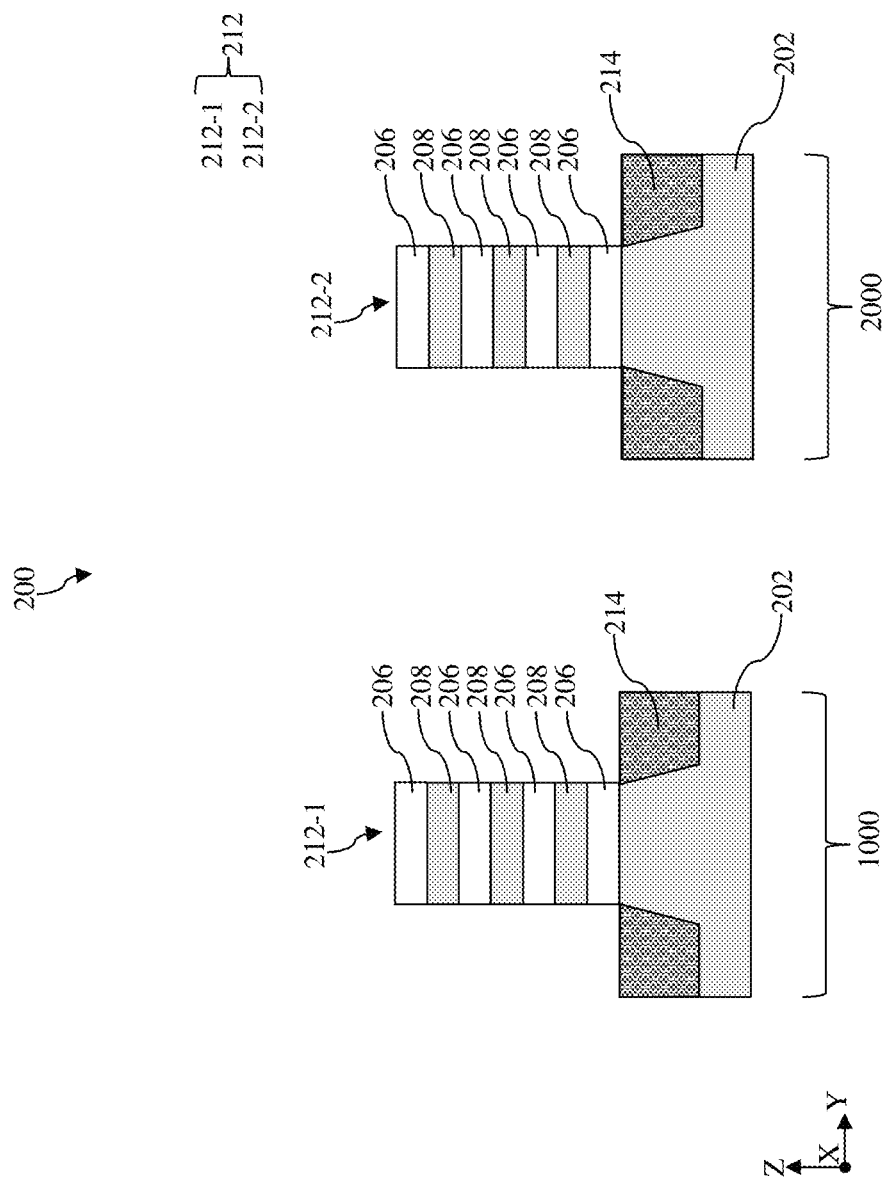

Referring to FIGS. 1 and 3, method 100 includes a block 104 where a first fin structure 212-1 (or first fin-shaped structure 212-1) is formed in the first area 1000 and a second fin structure 212-2 (or second fin-shaped structure 212-2) is formed in the second area 2000. As shown in FIG. 3, the first fin structure 212-1 is formed from the stack 204 and a portion of the substrate 202 and the second fin structure 212-2 is formed from the stack 204 and a portion of the substrate 202. For ease of reference, the first fin structure 212-1 and the second fin structure 212-2 may be collectively referred to as fin structures 212. In some embodiments, at block 104, the stack 204 and the substrate 202 (including the n-well 202N and the P-well 202P) are patterned to form the fin structures 212. The fin structures 212 extend vertically along the Z direction from the substrate 202. Each of the fin structures 212 includes a bottom portion formed from the substrate 202 and a top portion formed from the stack 204. The fin structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin structures 212 by etching the stack 204 and the substrate 202. The etching process can include dry etching, wet etching, reactive ion etching (RIE), and/or other suitable processes.

Referring still to FIGS. 1 and 3, method 100 includes a block 106 where an isolation feature 214 is formed. After the fin structures 212 are formed, isolation feature 214 is formed between neighboring fin structures 212. The isolation feature 214 may also be referred to as a shallow trench isolation (STI) feature 214. In an example process, a dielectric layer is first deposited over the workpiece 200, filling the trenches between fin structures 212 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, spin-on coating, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the isolation feature 214. As shown in FIG. 3, top portions of the fin structures 212 rise above the isolation feature 214. In some implementations represented in FIG. 3, the hard mask layer 210 may also be removed during the formation of the isolation feature 214.

Figure 4:
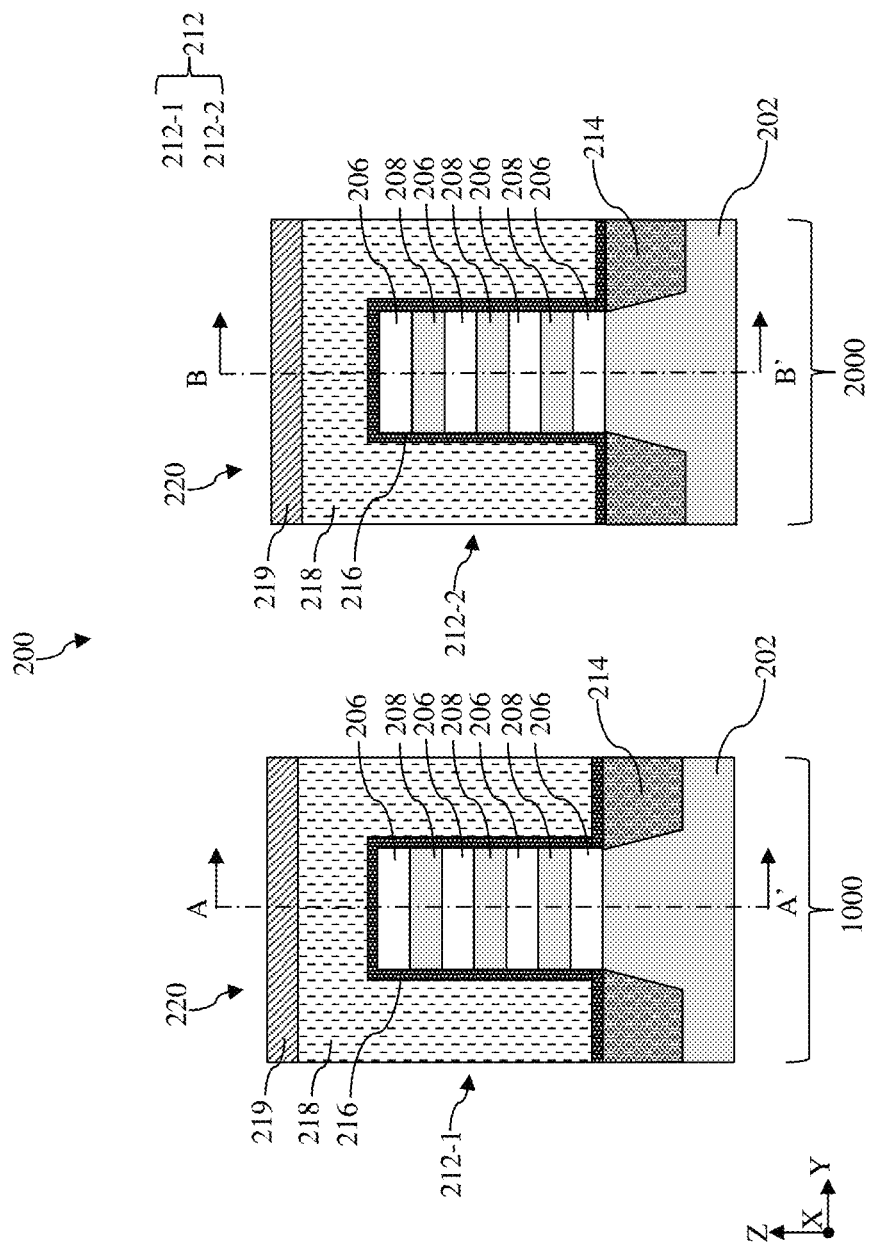
Figure 5:
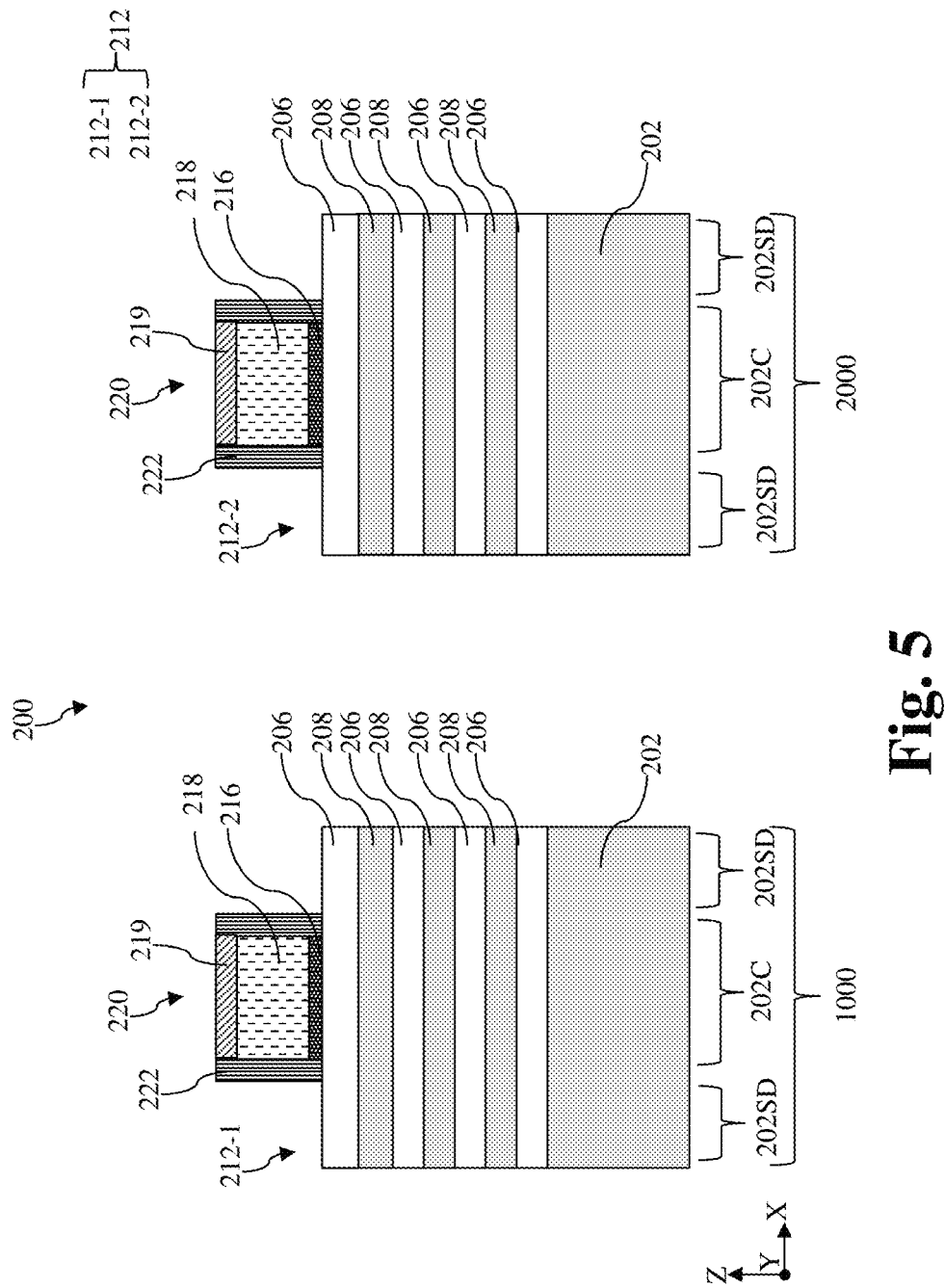

Referring to FIGS. 1, 4 and 5, method 100 includes a block 108 where dummy gate stacks 220 are formed over channel regions 202C of the fin structures 212. In some embodiments, a gate replacement process (or gate-last process) is adopted where the dummy gate stacks 220 serves as placeholders for functional gate structures. Other processes and configuration are possible. In some embodiments, the dummy gate stacks 220 are formed over the isolation feature 214 and are at least partially disposed over channel regions 202C of the fin structures 212. As shown in FIG. 4, the dummy gate stacks 220 extend lengthwise along the Y direction to wrap over the first fin structure 212-1 and the second fin structure 212-2. Each of the dummy gate stacks 220 includes a dummy dielectric layer 216 and a dummy gate electrode 218. To illustrate how the dummy gate stack 220 is disposed over the fin structures 212, cross-sectional views along the cross-section A-A' in the first area 1000 and cross-section B-B' in the second area 2000 are provided in FIG. 5. As shown in FIG. 5, the portion of the fin structures 212 underlying the dummy gate stacks 220 are channel regions 202C. The channel regions 202C also define the source/drain regions 202SD that are not vertically overlapped by the dummy gate stacks 220. Each of the channel regions 202C is disposed between two source/drain regions 202SD.

In some embodiments, the dummy gate stack 220 is formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In an example process, the dummy dielectric layer 216, a dummy electrode layer for the dummy gate electrode 218, and a gate-top hard mask layer 219 are sequentially deposited over the workpiece 200, including over the fin structures 212 (including the first fin structure 212-1 and the second fin structure 212-2). The deposition may be done using a CVD process, a sub-atmospheric CVD (SACVD) process, a flowable CVD process, an ALD process, a PVD process, or other suitable process. The dummy dielectric layer 216 and the dummy electrode layer are then patterned using photolithography processes to form the dummy gate stack 220. In some embodiments, the dummy dielectric layer 216 may include silicon oxide and the dummy gate electrode 218 may include polycrystalline silicon (polysilicon). The gate-top hard mask layer 219 may include a silicon oxide layer and a nitride layer. By way of example, the dummy dielectric layer 216 may be used to prevent damages to the fin structures 212 during subsequent processes.

Block 108 may also include operations to deposit a gate spacer layer 222 along sidewalls of the dummy gate stacks 220, as shown in FIG. 5. In some embodiments, the formation of the gate spacer layer 222 includes conformal deposition of one or more dielectric layers over the workpiece 200 and etch-back of the gate spacer layer 222 from top-facing surfaces of the workpiece 200. In an example process, the one or more dielectric layers are deposited using CVD, SACVD, or ALD and are etched back in an anisotropic etch process to form the gate spacer layer 222. The gate spacer layer 222 may include silicon oxide, silicon nitride, silicon carbide, silicon oxynitride, silicon carbonitride, silicon oxycarbide, silicon oxycarbonitride, and/or combinations thereof.

Figure 6:
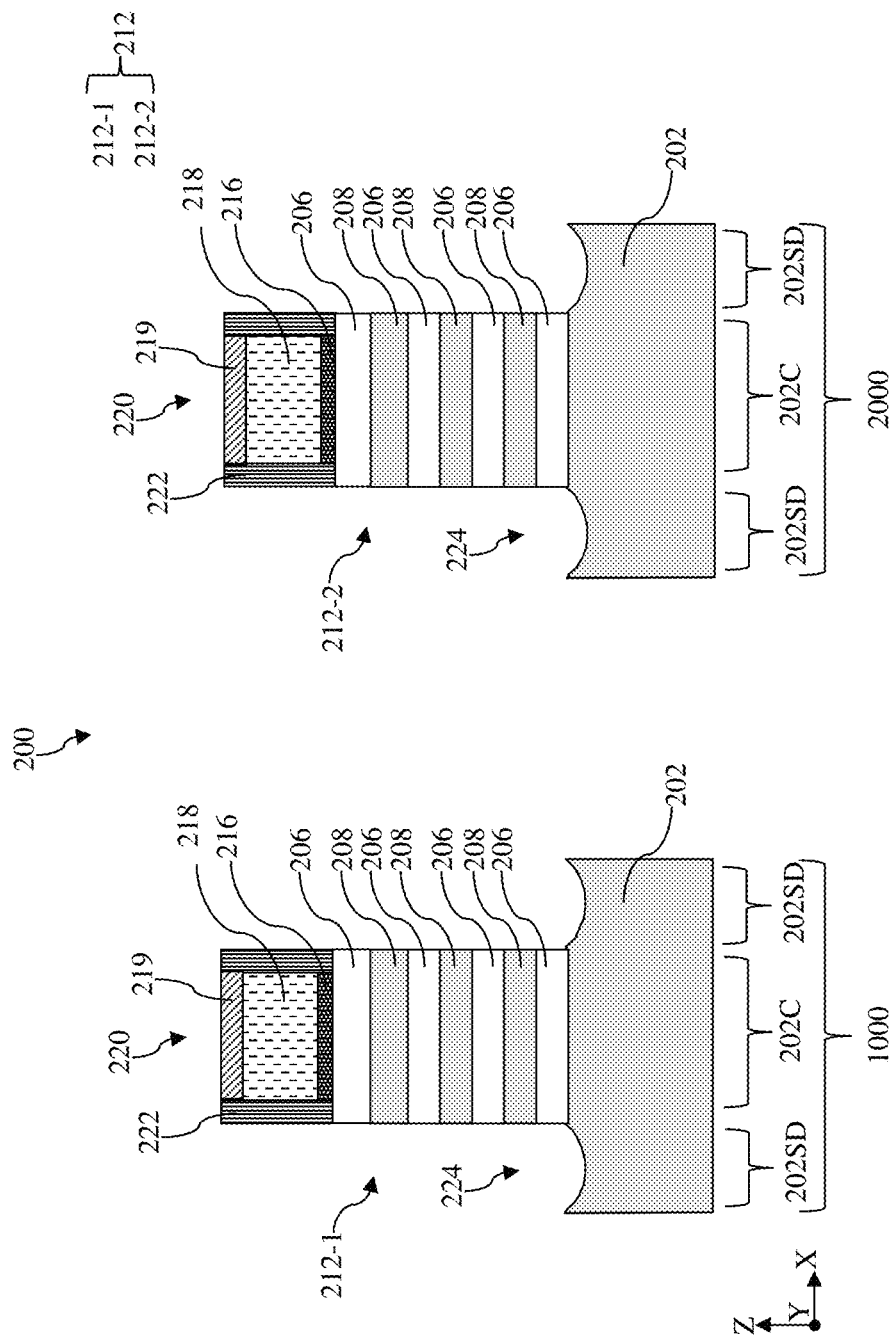

Referring to FIGS. 1 and 6, method 100 includes a block 110 where source/drain trenches 224 are formed in source/drain regions 202SD of the fin structures 212 (including the first fin structures 212-1 and the second fin structures 212-2). As shown in FIG. 6, the source/drain regions 202SD that are not masked by the gate-top hard mask layer 219, the gate spacer layer 222 or the gate spacer layers 222 are etched. In implementations shown in FIG. 6, the source/drain trenches 224 may extend partially into the substrate 202. The etch process at block 110 may be a dry etch process or a suitable etch process. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 6, sidewalls of the sacrificial layers 206 and the channel layers 208 are exposed in the source/drain trenches 224.

Figure 7:
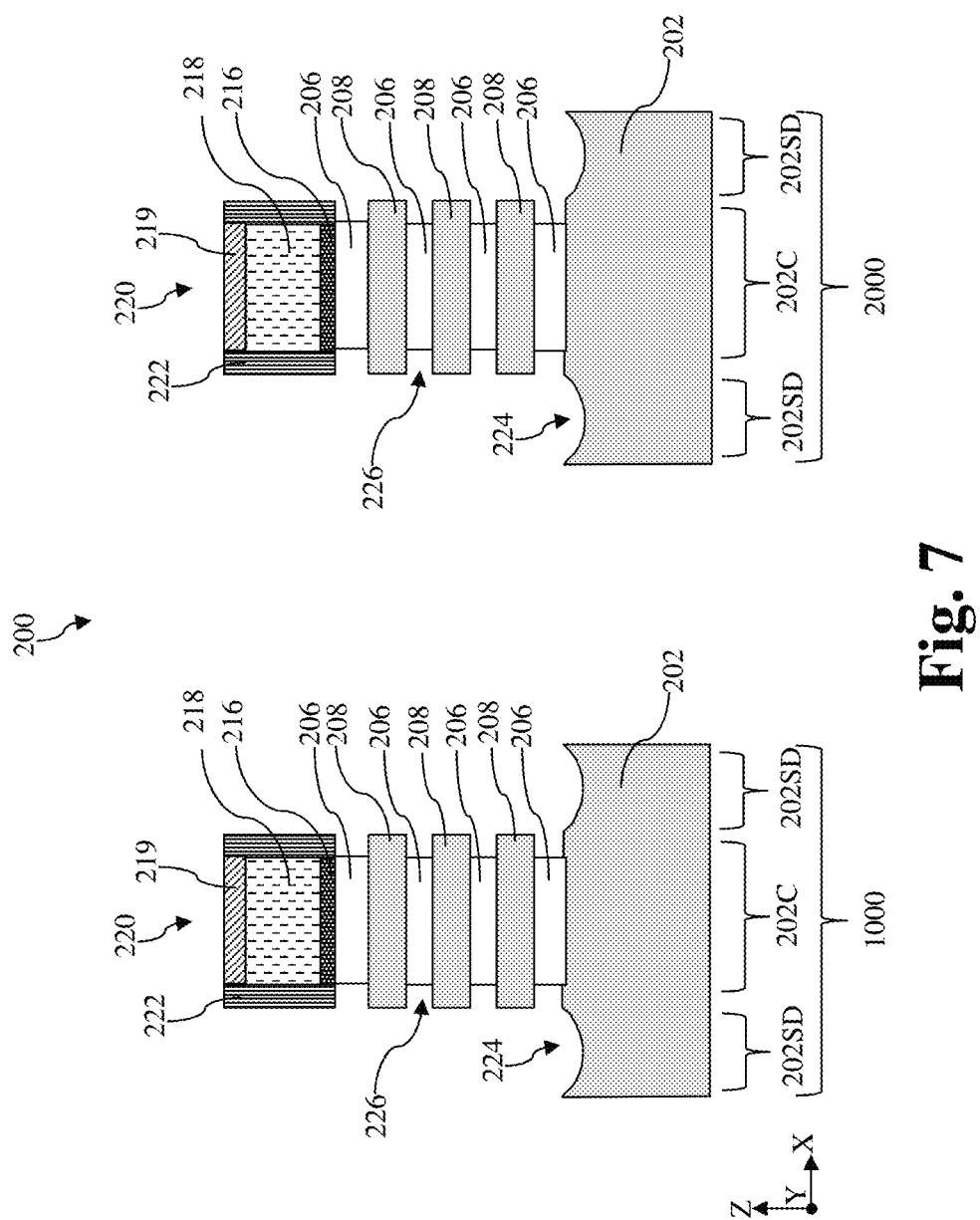

Referring to FIGS. 1 and 7, method 100 includes a block 112 where inner spacer recesses 226 are formed in the first area 1000 and the second area 2000. At block 112, the sacrificial layers 206 exposed in the source/drain trenches 224 are selectively and partially recessed to form inner spacer recesses 226 in the first area 1000 and the second area 2000, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant.

It is noted that operations in block 102 to block 112 may not be area specific. In other words, unless widths of the fin structures 212 or widths of the dummy gate stacks 220 are intentionally made different for the first area 1000 and the second area 2000, structures formed by following operations in blocks 102 to 112 are substantially the same across the workpiece 200.

Figure 8:
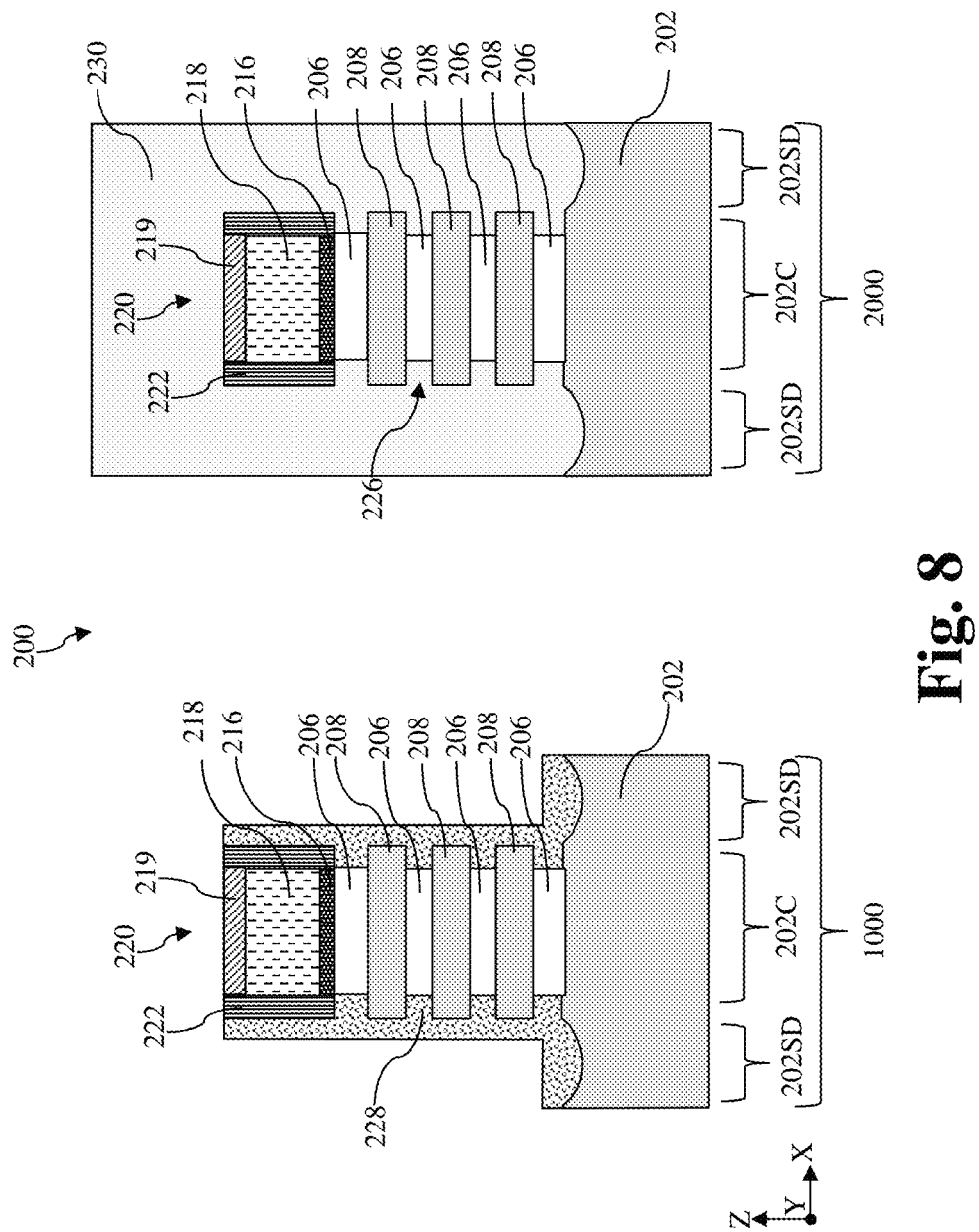

Referring to FIGS. 1 and 8, method 100 includes a block 114 where a first inner spacer layer 228 is selectively deposited over the inner spacer recesses 226 in the first area 1000 while the second area 2000 is covered and protected by a first masking layer 230. In some embodiments, the first masking layer 230 may include one or more photoresist layers. In an example process, the first masking layer 230 is first blanketly deposited over the workpiece 200 using flowable chemical vapor deposition (FCVD), spin-on coating, or a suitable deposition process. The first masking layer 230 is then patterned using photolithography processes where the first masking layer 230 is soft-baked, exposed to radiation reflected from or transmitting through a photomask, baked in a post-baked process, and developed in a developer solution. As shown in FIG. 8, the first masking layer 230 is patterned to cover the second area 2000 and expose the first area 1000. With the second area 2000 covered under the first masking layer 230, the first inner spacer layer 228 is conformally deposited over the first area 1000, including over and into the inner spacer recesses 226 in the first area 1000. The first inner spacer layer 228 may include silicon nitride (SiN) or other suitable dielectric material that may absorb oxygen in the presence of water or an oxygen-containing ambient. The conformal deposition may be performed using CVD, plasma-enhanced CVD (PECVD), low-pressure CVD (LPCVD), atomic layer deposition (ALD), plasma-enhanced ALD (PEALD), or a suitable deposition method.

Figure 9:
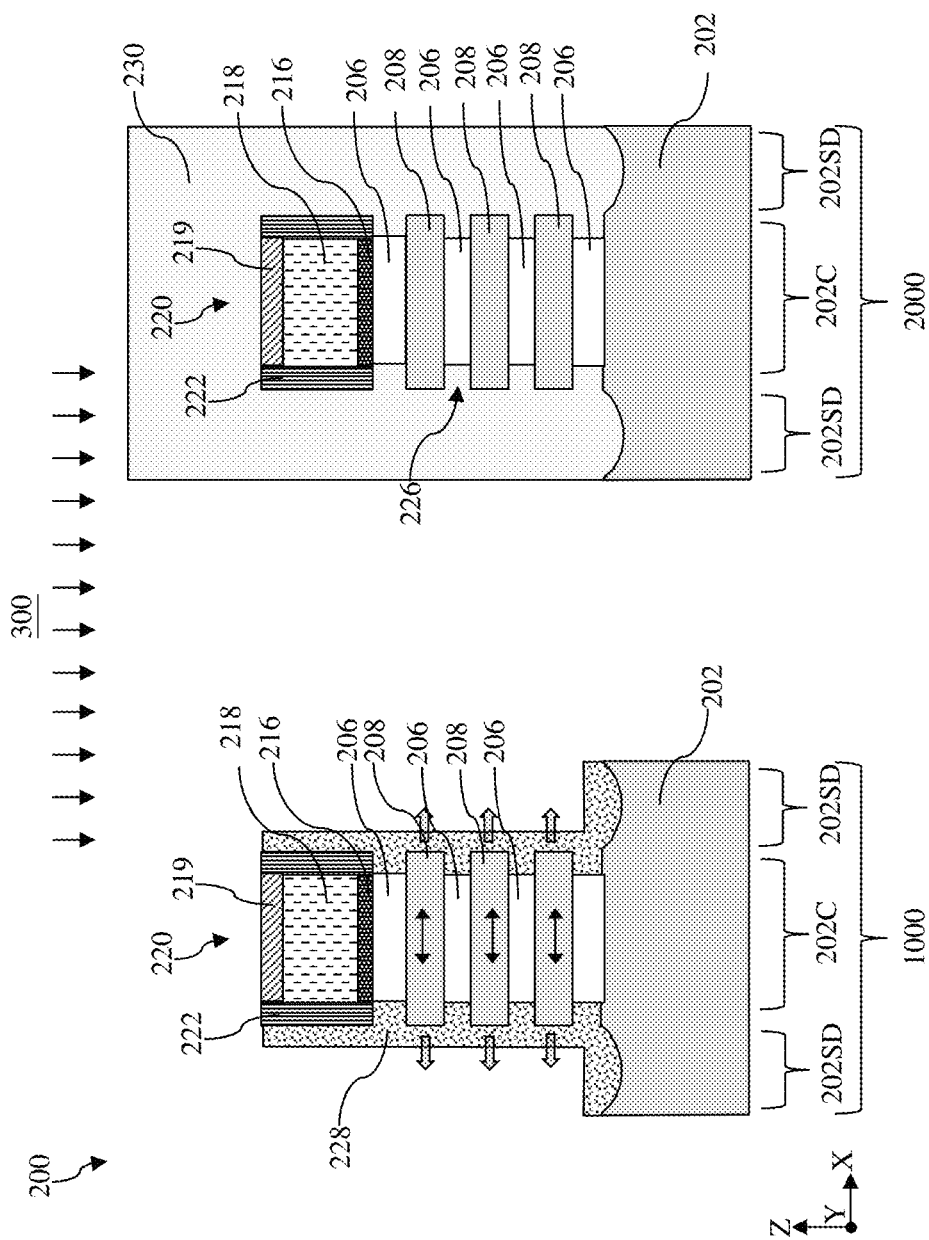

Referring to FIGS. 1 and 9, method 100 includes a block 116 where a first anneal process 300 is performed. In some embodiments, the first anneal process 300 includes a first anneal temperature T1 between about 500° C. and about 700° C. and is performed in an oxygen-containing ambient, such as a water vapor ambient. In some implementation, the first anneal process 300 may performed in a furnace for a duration between about 30 minutes and about 120 minutes. It is observed that the first anneal process 300 may oxidize the first inner spacer layer 228 or otherwise incorporate oxygen into the first inner spacer layer 228. The oxidation or incorporation of oxygen atoms causes the first inner spacer layer 228 to expand in volume. As shown by the arrow symbols in FIG. 9, expansion of the first inner spacer layer 228 may exert a tensile stress on the channel layers 208 in the channel region 202C in the first area 1000. The tensile stress acts on the channel layer 208 along the channel length direction (i.e., the X direction) and cause a tensile strain in the channel layer 208. It is observed that this tensile strain may improve electron mobility in the channel layers 208 in the first area 1000.

Figure 10:
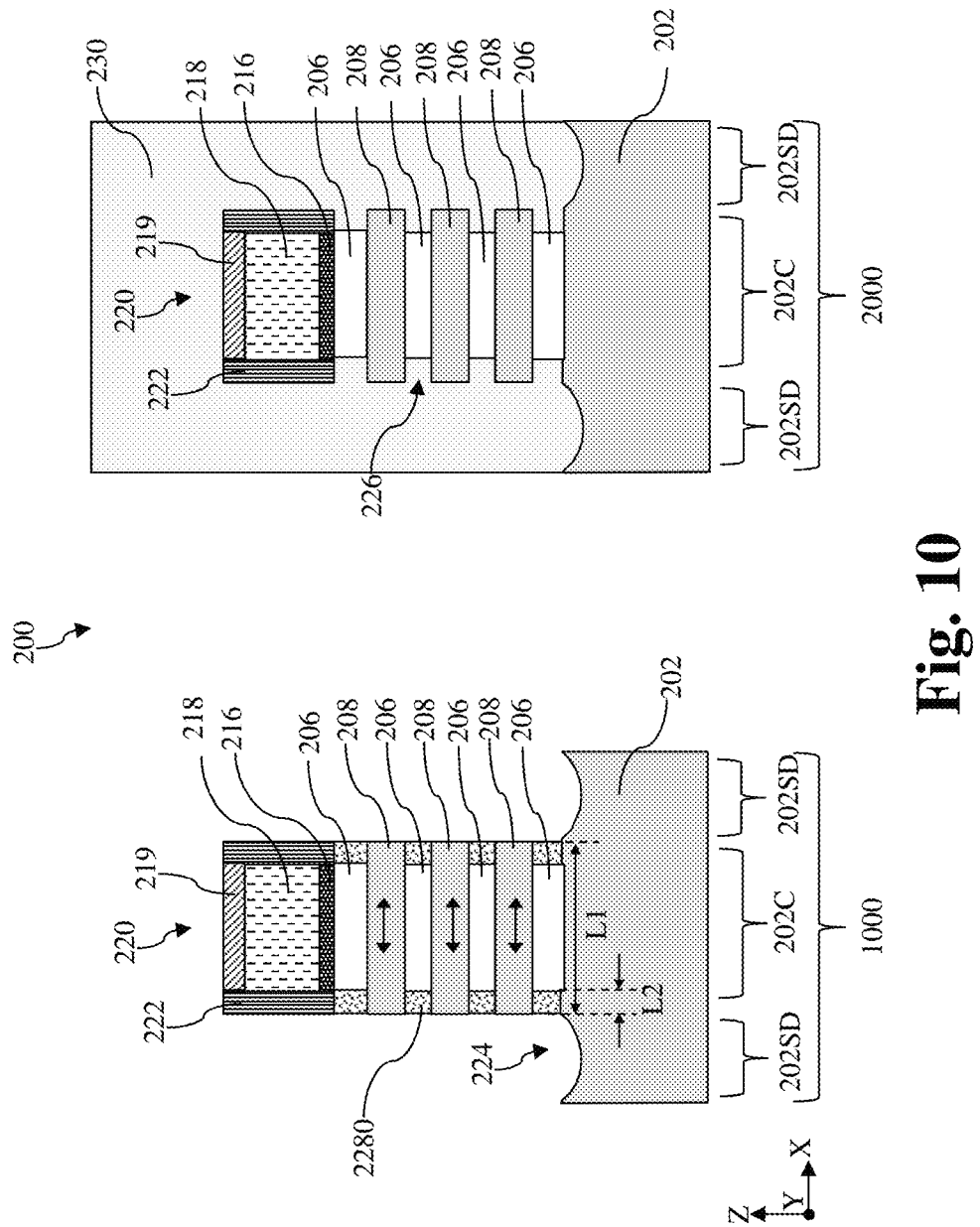

Referring to FIGS. 1 and 10, method 100 includes a block 118 where the first inner spacer layer 228 is recessed to form the first inner spacer features 2280. At block 118, the annealed first inner spacer layer 228 is then etched back to remove first inner spacer layer 228 outside of the inner spacer recesses 226 in the first area 1000 to form the first inner spacer features 2280, as illustrated in FIG. 10. In some embodiments, the recessing at block 118 may be performed using an anisotropic dry etch process. An example dry etch process may include a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 10, the recessing may also remove the first inner spacer layer 228 from the source/drain regions 202SD in the first area 1000. It is observed that, when the first inner spacer feature 2280 account for between one third (⅓) and about one half (½) of the length of the channel layer 208, the recessing at block 118 does not substantially release the tensile stress exerted on the channel layers 208. Referring to FIG. 10, the channel layer 208 in the channel region 202C in the first area 1000 has a first length (L1) along the X direction and the each of the first inner spacer features 2280 has a second length (L2) along the X direction. To retain the tensile stress after recessing, a total length of two first inner spacer features 2280 at both ends of a channel layer 208 (L2*2) is between about one third (⅓) and about one half (½) of the first length (L1). As will be described below, the source/drain features to be deposited in the source/drain trenches 224 in the first area 1000 also exert tensile stress on the channel layers 208 in the first area 1000. The earlier formed and annealed first inner spacer features 2280 may be regarded as first stage tensile stressor and the source/drain features in the first area 1000 may be regarded as second stage tensile stressor. Compared to conventional structures that only have source/drain features as a single-stage stressor, embodiments according to the present disclosure may be more efficient in exerting stress on the channel layers and improve carrier mobility.

Figure 11:
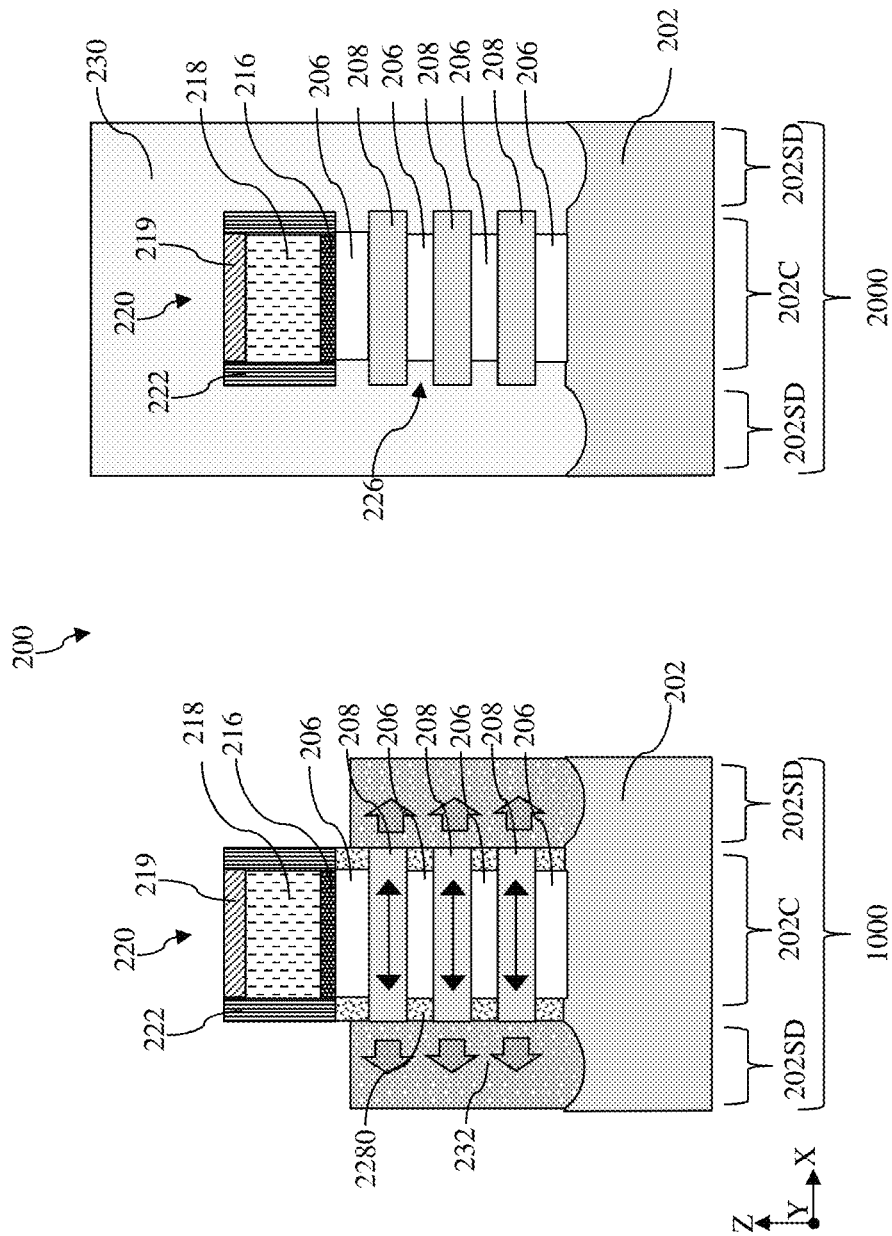

Referring to FIGS. 1 and 11, method 100 includes a block 120 where first source/drain features 232 are formed in the source/drain trenches 224 in the first area 1000. With the first masking layer 230 still covering the second area 2000, the first source/drain features 232 may be selectively deposited in the source/drain trenches 224 in the first area 1000. In some embodiments, the first source/drain features 232 may be formed using an epitaxial process, such as vapor-phase epitaxy (VPE), ultra-high vacuum CVD (UHV-CVD), molecular beam epitaxy (MBE), and/or other suitable processes. The epitaxial growth process may use gaseous and/or liquid precursors, which interact with the composition of the substrate 202 as well as the channel layers 208. In the embodiments represented in FIG. 10, the first source/drain features 232 formed over the first area 1000 are n-type source/drain features. The first source/drain features 232 may include silicon (Si), gallium arsenide (GaAs), arsenic-doped silicon (SiAs), phosphorus-doped silicon (SiP), phosphorus-doped gallium arsenide (GaAsP), or other suitable material. When the first source/drain features 232 are doped, they may be in-situ doped during the epitaxial process by introducing an n-type dopant, such as phosphorus (P), arsenic (As), or both. When the first source/drain features 232 are not in-situ doped with an n-type dopant, an implantation process (i.e., a junction implant process) may be performed to dope the first source/drain features 232 with an n-type dopant. As described above, the first source/drain features 232 may exert tensile stresses on the channel layers 208 in the channel region 202C of the first area 1000 and may be regarded as a second-stage tensile stressor while the first inner spacer features 2280 are regarded as a first-stage tensile stressor. The second-stage tensile stressor exerts more tensile stress than the first-stage tensile stressor. The first inner spacer features 2280 and the first source/drain features 232 synergistically and stage-wise exert tensile stresses on the channel layers 208 in the first area 1000, as shown by arrows in FIG. 11. After the formation of the first source/drain features 232, the first masking layer 230 is removed by ashing or a suitable process.

Figure 12:
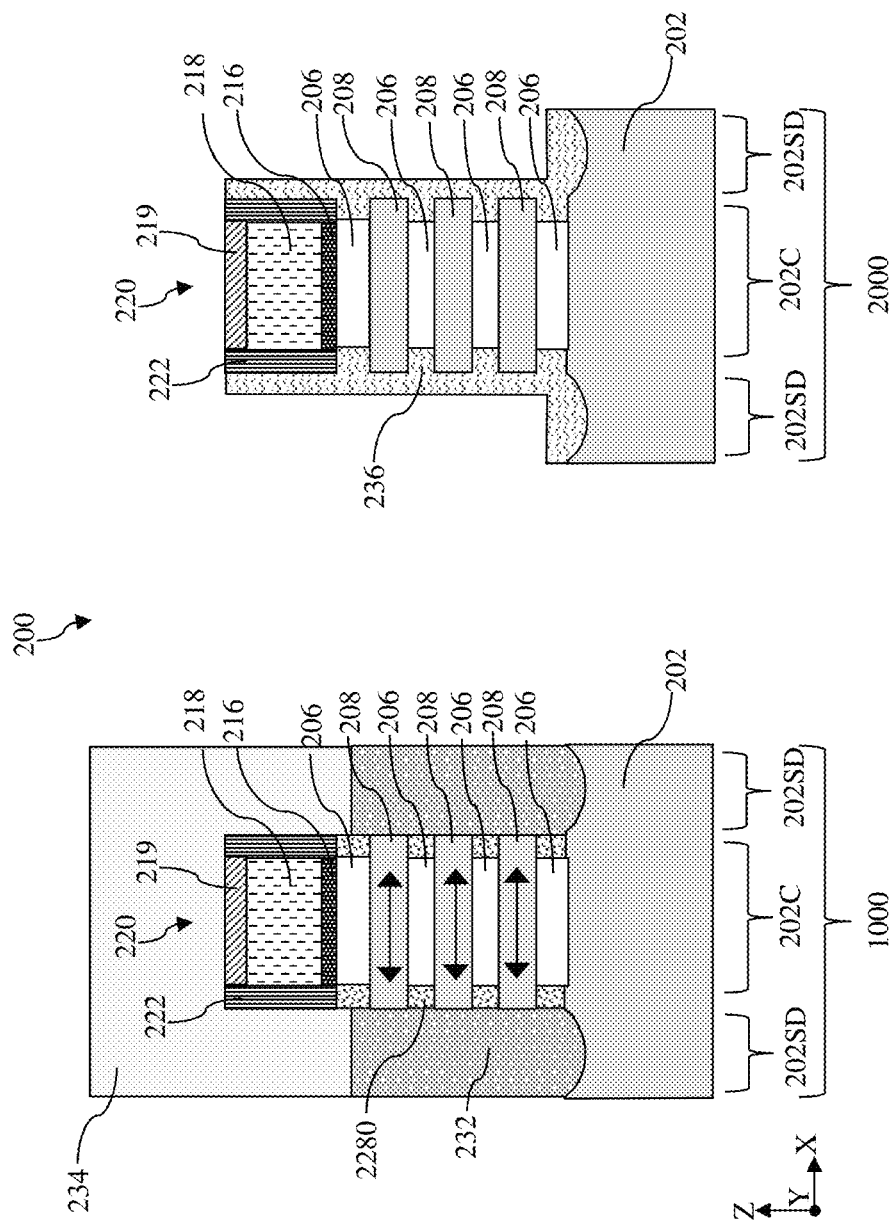

Referring to FIGS. 1 and 12, method 100 includes a block 122 where a second inner spacer layer 236 is selectively deposited over the inner spacer recesses 226 in the second area 2000 while the first area 1000 is covered and protected by a second masking layer 234. In some embodiments, the second masking layer 234, like the first masking layer 230, may include one or more photoresist layers. In an example process, the second masking layer 234 is first blanketly deposited over the workpiece 200 using flowable chemical vapor deposition (FCVD), spin-on coating, or a suitable deposition process. The second masking layer 234 is then patterned using photolithography processes where the second masking layer 234 is soft-baked, exposed to radiation reflected from or transmitting through a photomask, baked in a post-baked process, and developed in a developer solution. As shown in FIG. 12, the second masking layer 234 is patterned to cover the first area 1000 and expose the second area 2000. With the first area 1000 covered under the second masking layer 234, the second inner spacer layer 236 is conformally deposited over the second area 2000, including over and into the inner spacer recesses 226 in the second area 2000. In some embodiments, the second inner spacer layer 236 may include aluminum oxide or a suitable metal oxide that is doped with a dopant. Example dopants may include carbon, fluorine, or hydrogen. In one embodiment, the second inner spacer layer 236 includes aluminum oxide doped with fluorine and carbon. During the second anneal process 400 (to be described below), the second inner spacer layer 236 may densify or shrink due to scavenge or removal of impurities in the second inner spacer layer 236. In other words, the second anneal process 400 may cause condensation of the second inner spacer layer 236, leading to volume shrinkage. The conformal deposition may be performed using CVD, plasma-enhanced CVD (PECVD), low-pressure CVD (LPCVD), atomic layer deposition (ALD), plasma-enhanced ALD (PEALD), or a suitable deposition method.

Figure 13:
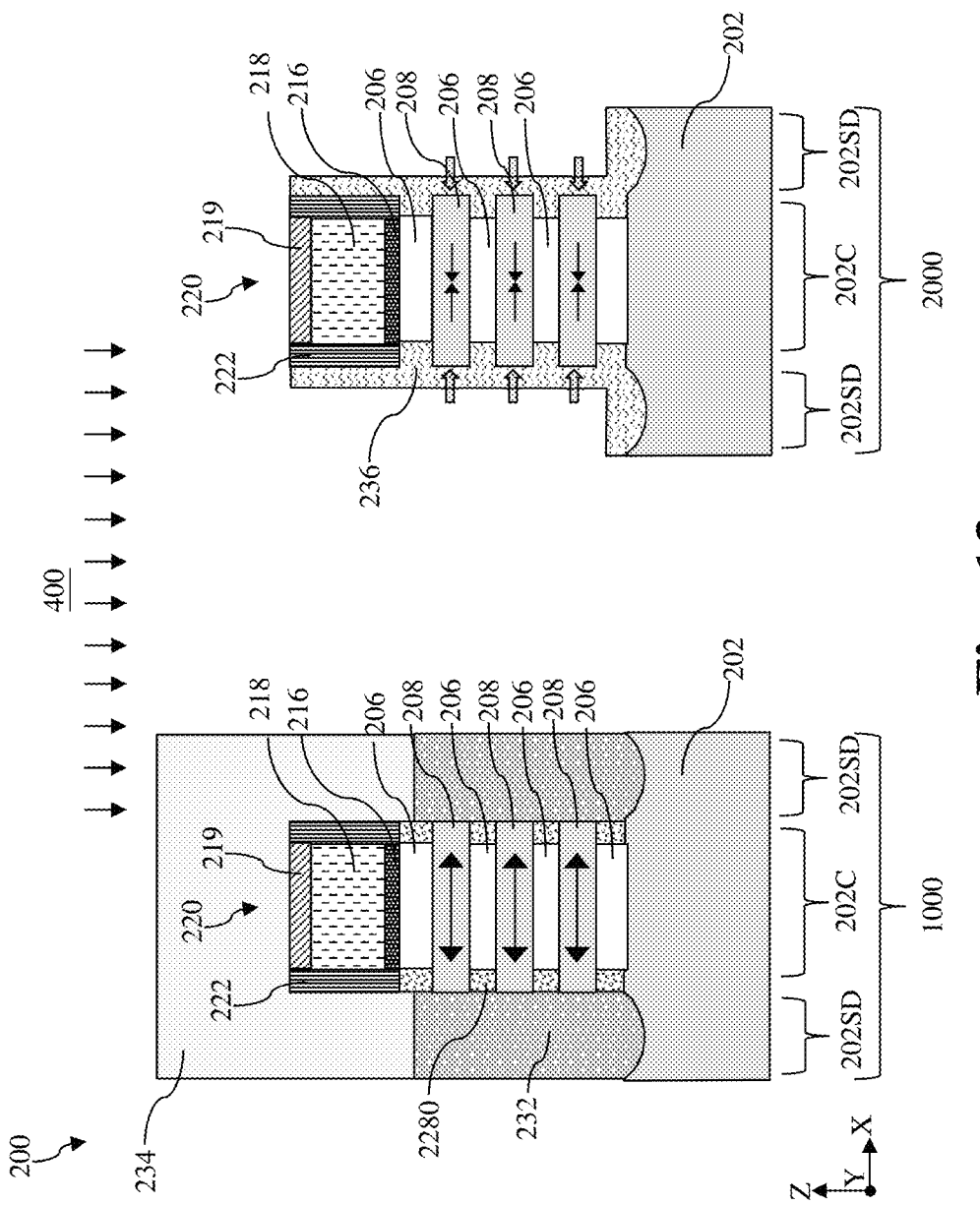

Referring to FIGS. 1 and 13, method 100 includes a block 124 where a second anneal process 400 is performed. In some embodiments, the second anneal process 400 may include a rapid thermal anneal (RTA) process, a laser spike anneal process, or a flash anneal process. In some instances, the anneal process includes a second anneal temperature T2 between about 650° C. and about 950° C. The second anneal process 400 may last for between 1 second and 3 seconds. It is observed that the second anneal process 400 may cause removal or scavenge of impurities in the second inner spacer layer 236 and result in a volume shrinkage of the second inner spacer layer 236. In some embodiments, the second anneal temperature T2 is greater than the first anneal temperature T1 because a higher temperature is needed to remove impurities in the second inner spacer layer 236 in order to cause a volume shrinkage. The shrinkage in volume of the second inner spacer layer 236 causes a compressive stress acting on the channel layer 208 (in the second area 2000) along the channel length direction X and cause a compressive strain in the channel layer 208. It is observed that this compressive strain may improve hole mobility in the channel layers 208 in the second area 2000.

Figure 14:
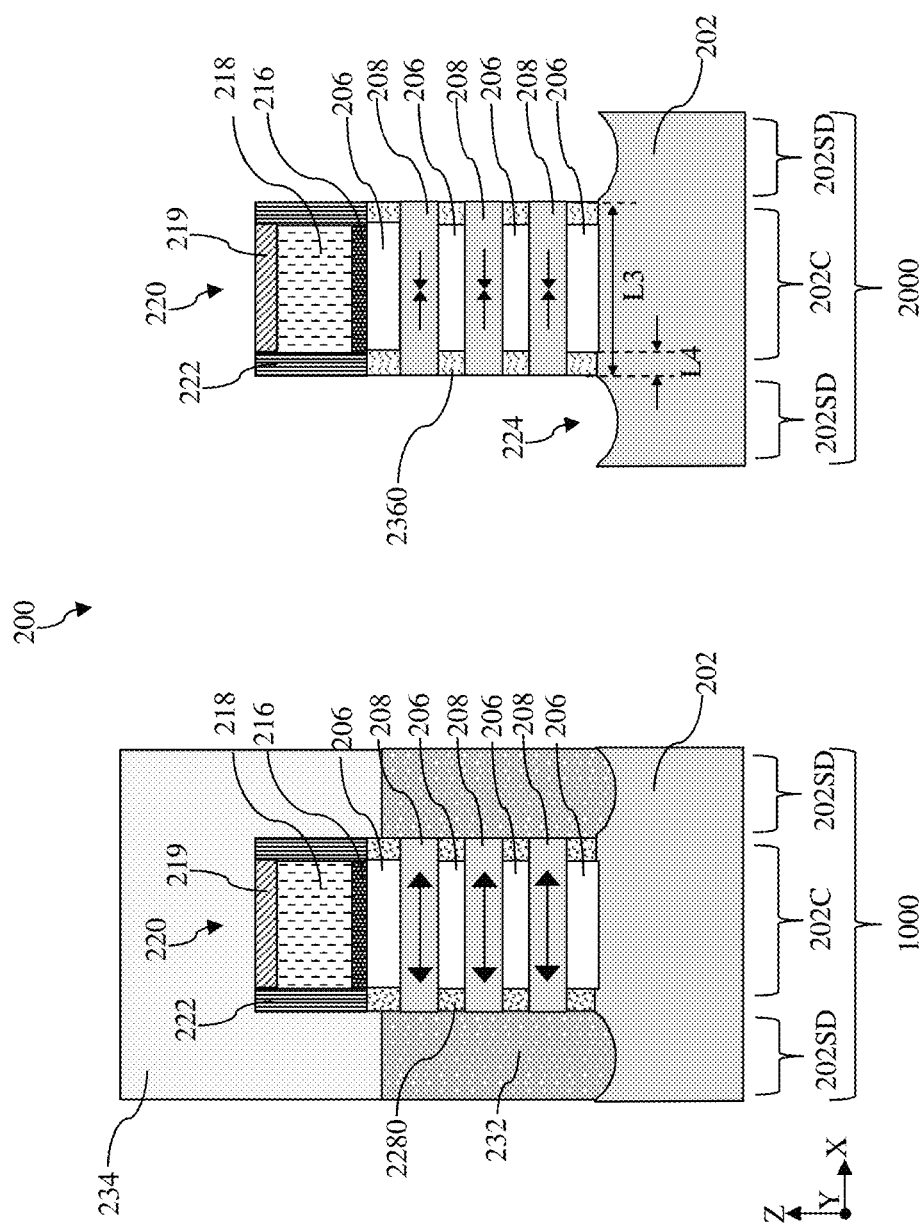

Referring to FIGS. 1 and 14, method 100 includes a block 126 where the second inner spacer layer 236 is recessed to form second inner spacer features 2360. At block 126, the annealed second inner spacer layer 236 is then etched back to remove the second inner spacer layer 236 outside of the inner spacer recesses 226 in the second area 2000 to form the second inner spacer features 2360, as illustrated in FIG. 14. In some embodiments, the recessing at block 126 may be performed using an anisotropic dry etch process. An example dry etch process may include a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 14, the recessing may also remove the second inner spacer layer 236 from the source/drain regions 202SD in the second area 2000. It is observed that, when the second inner spacer feature 2360 account for between one third (⅓) and about one half (½) of the length of the channel layer 208, the recessing at block 126 does not substantially release the compressive stress exerted on the channel layers 208. Referring to FIG. 14, the channel layer 208 in the channel region 202C in the second area 2000 has a third length (L3) along the X direction and the each of the second inner spacer features 2360 has a fourth length (L4) along the X direction. To retain the compressive stress after recessing, a total length of two second inner spacer features 2360 at both ends of a channel layer 208 (L4*2) is between about one third (⅓) and about one half (½) of the third length (L3). As will be described below, the source/drain features to be deposited in the source/drain trenches 224 in the second area 2000 also exert compressive stress on the channel layers 208 in the second area 2000. The earlier formed and annealed second inner spacer features 2360 may be regarded as first stage compressive stressor and the source/drain features in the second area 2000 may be regarded as second stage compressive stressor. Compared to conventional structures that only have source/drain features as a single-stage stressor, embodiments according to the present disclosure may be more efficient in exerting stress on the channel layers and improve carrier mobility.

Depending on the design of the semiconductor device 200, the first length L1 and the third length L3 may not be the same. For example, because the inner spacer recesses 226 in the first area 1000 and the second area 2000 are formed in the same process step, the inner spacer recesses 226 may be of similar dimensions in the first area 1000 and the second area 2000. When the third length L3 is smaller than the first length L1, the second inner spacer features 2360 may be proportionally larger in the second area 2000 to exert greater compressive stress on the channel layers 208 in the second area 2000. In some embodiments where a greater compressive stress is needed to improve much needed hole mobility in the silicon channel layers 208 in the second area 2000, the third length L3 in the second area 2000 is smaller than the first length L1 in the first area 1000.

Figure 15:
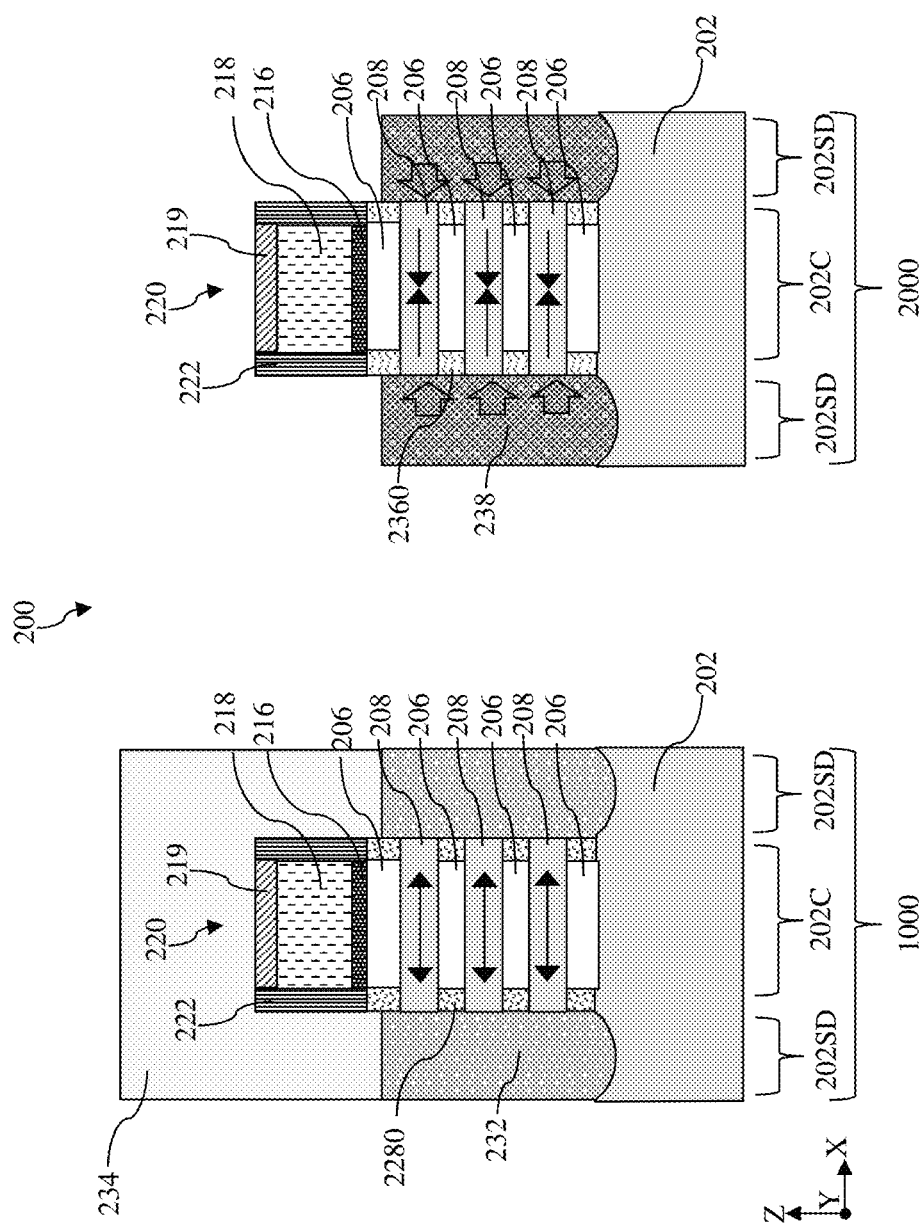

Referring to FIGS. 1 and 15, method 100 includes a block 128 where second source/drain features 238 are formed in the source/drain trenches 224 in the second area 2000. With the second masking layer 234 still covering the first area 1000, the second source/drain features 238 may be selectively deposited in the source/drain trenches 224 in the second area 2000. In some embodiments, the second source/drain features 238 may be formed using an epitaxial process, such as vapor-phase epitaxy (VPE), ultra-high vacuum CVD (UHV-CVD), molecular beam epitaxy (MBE), and/or other suitable processes. The epitaxial growth process may use gaseous and/or liquid precursors, which interact with the composition of the substrate 202 as well as the channel layers 208. In the embodiments represented in FIG. 15, the second source/drain features 238 formed over the second area 2000 are p-type source/drain features. The second source/drain features 238 may include germanium (Ge), silicon germanium (SiGe), aluminum-doped gallium arsenide (AlGaAs), boron-doped silicon germanium (SiGeB), or other suitable material. When the second source/drain features 238 are doped, they may be in-situ doped during the epitaxial process by introducing a p-type dopant, such as aluminum (Al), or boron (B), or both. When the second source/drain features 238 are not in-situ doped with a p-type dopant, an implantation process (i.e., a junction implant process) may be performed to dope the second source/drain features 238 with a p-type dopant. As described above, the second source/drain features 238 may exert compressive stresses on the channel layers 208 in the channel region 202C of the second area 2000 and may be regarded as a second-stage compressive stressor while the second inner spacer features 2360 are regarded as a first-stage compressive stressor. The second inner spacer features 2360 and the second source/drain features 238 synergistically and stage-wise exert compressive stresses on the channel layers 208 in the second area 2000, as shown by arrows in FIG. 15. After the formation of the second source/drain features 238, the second masking layer 234 is removed by ashing or a suitable process.

Although the blocks 114, 116, 118, and 120 are described as being performed before blocks 122, 124, 126, and 128, they may be performed after blocks 122, 124, 126, and 128 as well. That is, the second inner spacer features 2360 and the second source/drain features 238 may be selectively formed in the second area 2000 before the first inner spacer features 2280 and the first source/drain features 232 are selectively formed in the first area 1000. Details of this alternative process are omitted for brevity.

Figure 16:
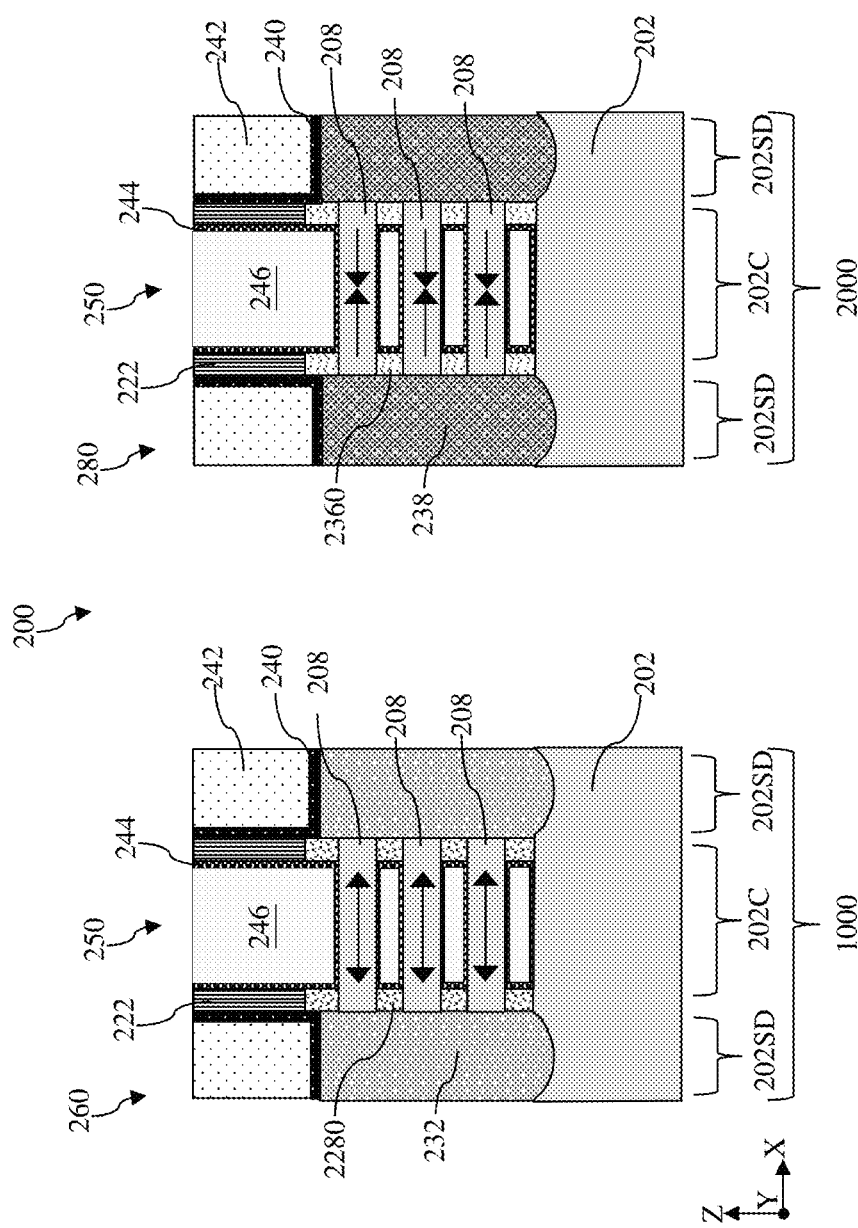

Referring to FIGS. 1 and 16, method 100 may include further processes. In some embodiments, these further processes are not specific to either the first area 1000 or the second area 2000 and may be performed with further masking layers. Such further processes may include, for example, deposition of a contact etch stop layer (CESL) 240, a deposition of an interlayer dielectric (ILD) layer 242, removal of the dummy gate stack 220 (shown in FIG. 15), selective removal of the sacrificial layers 206 in the channel regions 202C, and formation of gate structures 250.

In an example process, the CESL 240 is first deposited over the workpiece 200. The CESL 240 may include silicon nitride, silicon oxide, silicon oxynitride, and/or other materials known in the art. The CESL 240 may be deposited using ALD, plasma-enhanced chemical vapor deposition (PECVD) process and/or other suitable deposition or oxidation processes. As shown in FIG. 16, the CESL 240 may be deposited on top surfaces of the first source/drain features 232, the second source/drain features 238, and along sidewalls of the gate spacer layer 222. The ILD layer 242 is deposited over the CESL 240. In some embodiments, the ILD layer 242 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 242 may be deposited by spin-on coating, a PECVD process or other suitable deposition technique. In some embodiments, after formation of the ILD layer 242, the workpiece 200 may be annealed to improve integrity of the ILD layer 242. To remove excess materials and to expose top surfaces of the dummy gate stacks 220, a planarization process, such a chemical mechanical polishing (CMP) process may be performed. The exposed dummy gate stacks 220 are then removed from the workpiece 200. The removal of the dummy gate stacks 220 results in gate trenches over the channel regions 202C. The removal of the dummy gate stacks 220 may include one or more etching processes that are selective to the material in the dummy gate stack 220. For example, the removal of the dummy gate stack 220 may be performed using as a selective wet etch, a selective dry etch, or a combination thereof. After the removal of the dummy gate stacks 220, sidewalls of the channel layers 208 and sacrificial layers 206 in the channel regions 202C are exposed in the gate trenches.

After the removal of the dummy gate stacks 220, the sacrificial layers 206 between the channel layers 208 may be selectively removed to release the channel layers 208 to form channel members 208. It is noted that the same reference numeral 208 is used to denote channel members 208 for simplicity. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments where the sacrificial layers 206 are formed of silicon germanium, the selective removal includes silicon germanium oxidation followed by a silicon germanium oxide removal. For example, the oxidation may be provided by ozone clean and then silicon germanium oxide removed by an etchant such as $NH_4OH$. Gate structures 250 are then deposited into the gate trenches to wrap around each of the channel members 208 on the Y-Z plane in the first area 1000 and the second area 2000. In some embodiments, the gate structure 250 includes a gate dielectric layer 244 and a gate electrode 246 formed over the gate dielectric layer 244. In some embodiments, the gate dielectric layer 244 may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, atomic layer deposition (ALD), chemical vapor deposition (CVD), and/or other suitable method. The high-K dielectric layer may include a high-K dielectric layer such as hafnium oxide. Alternatively, the high-K dielectric layer may include other high-K dielectrics, such as hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K dielectric layer may be formed by ALD, physical vapor deposition (PVD), CVD, oxidation, and/or other suitable methods.

The gate electrode 246 of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode 246 of the gate structure 250 may be formed by ALD, PVD, CVD, e-beam evaporation, or other suitable process. In various embodiments, a planarization process, such as a CMP process, may be performed to remove excessive materials to provide a substantially planar top surface of the gate structures 250.

As shown in FIG. 16, upon conclusion of the operations at block 130, a first MBC transistor 260 is formed in the first area 1000 of the semiconductor device 200 and a second MBC transistor 280 is formed in the second area 2000 of the semiconductor device 200. The first inner spacer features 2280 and the first source/drain features 232 synergistically exert tensile stresses on the channel members 208 in the first area 1000 to improve electron mobility in the channel members 208 and increase drive current of the first MBC transistor 260. The second inner spacer features 2360 and the second source/drain features 238 synergistically exert compressive stresses on the channel layers 208 in the second area 2000 to improve hole mobility in the channel members 208 and increase drive current of the second MBC transistor 280. In the embodiments represented in FIG. 16, the first MBC transistor 260 is an n-type MBC transistor and the second MBC transistor 280 is a p-type MBC transistor.

Although not intended to be limiting, one or more embodiments of the present disclosure provide many benefits to a semiconductor device and the formation thereof. For example, the present disclosure provides embodiments of a semiconductor device that includes a first area for n-type MBC transistors and a second area for p-type MBC transistors. These embodiments implement first inner spacer features in the first area and second inner spacer features in the second area. The first inner spacer features exert tensile stress on the channel members of the n-type MBC transistors to improve electron mobility. The second inner spacer features exert compressive stress on the channel members of the p-type MBC transistors to improve hole mobility. A composition of the first inner spacer features is different from the second inner spacer features. As a result, the n-type MBC transistors and p-type MBC transistors of the present disclosure have improved performance.

In one exemplary aspect, the present disclosure is directed to a method. The method includes depositing a stack over a substrate, the stack including a plurality of channel layers interleaved by a plurality of sacrificial layers, forming a first fin structure from the stack in a first area of the substrate and forming a second fin structure from the stack in a second area of the substrate, depositing a first dummy gate stack over a channel region of the first fin structure and a second dummy gate stack over a channel region of the second fin structure, recessing source/drain regions of the first fin structure and source/drain regions of the second fin structure to form first source/drain trenches and second source/drain trenches, respectively, selectively and partially etching the plurality of sacrificial layers to form first inner spacer recesses in the first area and second inner spacer recesses in the second area, forming first inner spacer features in the first inner spacer recesses, and forming second inner spacer features in the second inner spacer recesses. A composition of the first inner spacer features is different from a composition of the second inner spacer features.

In some embodiments, the first inner spacer features include silicon nitride and the second inner spacer features include aluminum oxide. In some embodiments, the second inner spacer features are doped with carbon or fluorine. In some implementations, the forming of the first inner spacer features includes selectively depositing a first inner spacer layer over the first area and performing a first anneal process to anneal the first inner spacer layer. The forming of the second inner spacer features includes selectively depositing a second inner spacer layer and performing a second anneal process to anneal the second inner spacer layer. The second anneal process is different from the first anneal process. In some instances, the first anneal process causes expansion of the first inner spacer layer and a tensile strain in the channel layers in the channel region of the first fin structure. In some implementations, the second anneal process causes shrinkage of the second inner spacer layer and a compressive strain in the channel layers in the channel region of the second fin structure. In some embodiments, the first anneal process includes an anneal temperature between about 500° C. and about 700° C. In some instances, the second anneal process includes an anneal temperature between about 650° C. and about 950° C. In some implementations, the first anneal process includes an oxygen-containing ambient.

In another exemplary aspect, the present disclosure is directed to a method. The method includes forming a first fin structure in an n-type device area of a substrate and a second fin structure in a p-type device area of the substrate, wherein each of the first fin structure and the second fin structure includes a plurality of channel layers interleaved by a plurality of sacrificial layers, depositing a first dummy gate stack over a channel region of the first fin structure and a second dummy gate stack over a channel region of the second fin structure, recessing source/drain regions of the first fin structure and source/drain regions of the second fin structure to form to form first source/drain trenches and second source/drain trenches, respectively, selectively and partially etching the plurality of sacrificial layers to form first inner spacer recesses in the n-type device area and second inner spacer recesses in the p-type device area, selectively depositing a first inner spacer layer over the first inner spacer recesses, after the selectively depositing of the first inner spacer layer, performing a first anneal process, after the first anneal process, forming n-type source/drain features in the first source/drain trenches, selectively depositing a second inner spacer layer over the second inner spacer recesses, after the selectively depositing of the second inner spacer layer, performing a second anneal process, and after the second anneal process, forming p-type source/drain features in the second source/drain trenches.

In some embodiments, a composition of the first inner spacer layer is different from a composition of the second inner spacer layer, the first inner spacer layer expands in volume during the first anneal process, and the second inner spacer layer shrinks in volume during the second anneal process. In some implementations, the first inner spacer layer include silicon nitride and the second inner spacer layer include aluminum oxide doped with fluorine and carbon. In some implementations, an anneal temperature of the first anneal process is smaller than an anneal temperature of the second anneal process. In some instances, the first anneal process includes a duration between about 30 minutes and about 120 minutes. In some implementations, the second anneal process includes a duration between about 1 second and 3 seconds. In some instances, the first anneal process is a furnace anneal process and the second anneal process is a rapid thermal annealing (RTA) process. In some embodiments, the selectively depositing of the first inner spacer layer includes selectively forming a first masking layer to cover the p-type device area and to expose the n-type device area, and the selectively depositing of the second inner spacer layer includes selectively forming a second masking layer to cover the n-type device area and to expose the p-type device area.

In yet another exemplary aspect, the present disclosure is directed to a semiconductor device. The semiconductor device includes a first plurality of channel members extending between two n-type source/drain features, a plurality of first inner spacer features interleaving the first plurality of channel members, a first gate structure wrapping around each of the first plurality of channel members, a second plurality of channel member extending between two p-type source/drain features, a plurality of second inner spacer features interleaving the second plurality of channel members, and a second gate structure wrapping around each of the second plurality of channel members. A composition of the plurality of first inner spacer features is different from a composition of the plurality of second inner spacer features.

In some embodiments, the plurality of first inner spacer features include silicon nitride and the plurality of second inner spacer features include aluminum oxide. In some implementations, the plurality of first inner spacer features exert a compressive stress on the first plurality of channel members and the plurality of second inner spacer features exert a tensile stress on the second plurality of channel members.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a stack over a substrate, the stack comprising a plurality of channel layers interleaved by a plurality of sacrificial layers;
forming a first fin structure from the stack in a first area of the substrate and forming a second fin structure from the stack in a second area of the substrate;
depositing a first dummy gate stack over a channel region of the first fin structure and a second dummy gate stack over a channel region of the second fin structure;
recessing source/drain regions of the first fin structure and source/drain regions of the second fin structure to form first source/drain trenches and second source/drain trenches, respectively;
selectively and partially etching the plurality of sacrificial layers to form first inner spacer recesses in the first area and second inner spacer recesses in the second area;
forming first inner spacer features in the first inner spacer recesses; and
forming second inner spacer features in the second inner spacer recesses,
wherein a composition of the first inner spacer features is different from a composition of the second inner spacer features,
wherein the plurality of channel layers comprise silicon,
wherein the plurality of sacrificial layers comprise silicon germanium,
wherein the forming of the first inner spacer features comprises selectively depositing a first inner spacer layer over the first area and performing a first anneal process to anneal the first inner spacer layer,
wherein the forming of the second inner spacer features comprises selectively depositing a second inner spacer layer and performing a second anneal process to anneal the second inner spacer layer,
wherein the second anneal process is different from the first anneal process.

2. The method of claim 1,
wherein the first inner spacer features comprise silicon nitride,
wherein the second inner spacer features comprise aluminum oxide.

3. The method of claim 1, wherein the second inner spacer features are doped with carbon or fluorine.

4. The method of claim 1, wherein the first anneal process causes expansion of the first inner spacer layer and a tensile strain in the channel layers in the channel region of the first fin structure.

5. The method of claim 1, wherein the second anneal process causes shrinkage of the second inner spacer layer and a compressive strain in the channel layers in the channel region of the second fin structure.

6. The method of claim 1, wherein the first anneal process comprises an anneal temperature between about 500° C. and about 700° C.

7. The method of claim 1, wherein the second anneal process comprises an anneal temperature between about 650° C. and about 950° C.

8. The method of claim 1, wherein the first anneal process comprises an oxygen-containing ambient.

9. A method, comprising:
forming a first fin structure in an n-type device area of a substrate and a second fin structure in a p-type device area of the substrate, wherein each of the first fin structure and the second fin structure comprises a plurality of channel layers interleaved by a plurality of sacrificial layers;
depositing a first dummy gate stack over a channel region of the first fin structure and a second dummy gate stack over a channel region of the second fin structure;
recessing source/drain regions of the first fin structure and source/drain regions of the second fin structure to form to form first source/drain trenches and second source/drain trenches, respectively;
selectively and partially etching the plurality of sacrificial layers to form first inner spacer recesses in the n-type device area and second inner spacer recesses in the p-type device area;
selectively depositing a first inner spacer layer over the first inner spacer recesses;
after the selectively depositing of the first inner spacer layer, performing a first anneal process;
after the first anneal process, forming n-type source/drain features in the first source/drain trenches;

selectively depositing a second inner spacer layer over the second inner spacer recesses;

after the selectively depositing of the second inner spacer layer, performing a second anneal process; and after the second anneal process, forming p-type source/drain features in the second source/drain trenches.

10. The method of claim 9,
wherein a composition of the first inner spacer layer is different from a composition of the second inner spacer layer,
wherein the first inner spacer layer expands in volume during the first anneal process,
wherein the second inner spacer layer shrinks in volume during the second anneal process.

11. The method of claim 9,
wherein the first inner spacer layer comprise silicon nitride,
wherein the second inner spacer layer comprise aluminum oxide doped with fluorine and carbon.

12. The method of claim 9, wherein an anneal temperature of the first anneal process is smaller than an anneal temperature of the second anneal process.

13. The method of claim 9, wherein the first anneal process comprises a duration between about 30 minutes and about 120 minutes.

14. The method of claim 9, wherein the second anneal process comprises a duration between about 1 second and 3 seconds.

15. The method of claim 9,
wherein the first anneal process is a furnace anneal process,
wherein the second anneal process is a rapid thermal annealing (RTA) process.

16. The method of claim 9,
wherein the selectively depositing of the first inner spacer layer comprises selectively forming a first masking layer to cover the p-type device area and to expose the n-type device area,
wherein the selectively depositing of the second inner spacer layer comprises selectively forming a second masking layer to cover the n-type device area and to expose the p-type device area.

17. A semiconductor device, comprising:
a substrate;
a first plurality of channel members disposed over a p-type well on the substrate and extending between two n-type source/drain features along a direction;
a plurality of first inner spacer features interleaving the first plurality of channel members;
a first gate structure wrapping around each of the first plurality of channel members;
a second plurality of channel member disposed over an n-type well on the substrate and extending between two p-type source/drain features along the direction;
a plurality of second inner spacer features interleaving the second plurality of channel members; and
a second gate structure wrapping around each of the second plurality of channel members,
wherein a composition of the plurality of first inner spacer features is different from a composition of the plurality of second inner spacer features,
wherein the first plurality of channel members and the second plurality of channel members comprise a same composition,
wherein the two n-type source/drain features and the two p-type source/drain features partially extend into the substrate.

18. The semiconductor device of claim 17,
wherein the plurality of first inner spacer features comprise silicon nitride to exert a compressive stress on the first plurality of channel members,
wherein the plurality of second inner spacer features comprise aluminum oxide to exert a tensile stress on the second plurality of channel members.

19. The semiconductor device of claim 17, wherein the first plurality of channel members and the second plurality of channel members comprise silicon.

20. The semiconductor device of claim 17,
wherein each of the first plurality of channel members has a first length (L1) along the direction,
wherein each of the first plurality of inner spacer features has a second length (L2) along the direction,
wherein a ratio of two times of the second length (L2) and the first length (L1) is between about one third (⅓) and about one half (½).

* * * * *